(12) United States Patent
Jobetto et al.

(10) Patent No.: US 7,064,440 B2
(45) Date of Patent: Jun. 20, 2006

(54) SEMICONDUCTOR DEVICE

(75) Inventors: Hiroyasu Jobetto, Hachioji (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/041,040

(22) Filed: Jan. 21, 2005

(65) Prior Publication Data

US 2005/0161823 A1    Jul. 28, 2005

(30) Foreign Application Priority Data

Jan. 27, 2004   (JP)   ............................. 2004-018535

(51) Int. Cl.
*H01L 23/48* (2006.01)

(52) U.S. Cl. ............. 257/758; 257/210; 257/738; 257/759; 257/760

(58) Field of Classification Search ........... 257/210, 257/738, 758, 759, 760
See application file for complete search history.

(56) References Cited

U.S. PATENT DOCUMENTS 6,765,299 B1 *  7/2004  Takahashi et al. .......... 257/777
6,770,971 B1 *  8/2004  Kouno et al. ............... 257/734

FOREIGN PATENT DOCUMENTS

JP    2003-298005 A    10/2003

* cited by examiner

*Primary Examiner*—Andy Huynh
(74) *Attorney, Agent, or Firm*—Frishauf, Holtz, Goodman & Chick, P.C.

(57) ABSTRACT

A semiconductor device includes a semiconductor constructing body formed on a base member, and having a semiconductor substrate and a plurality of external connecting electrodes formed on the semiconductor substrate. A wiring board is formed around the semiconductor constructing body, and has first interconnections on at least a surface thereof. Second interconnections are formed on the semiconductor constructing body and wiring board, and electrically connected to the external connecting electrodes of the semiconductor constructing body.

23 Claims, 18 Drawing Sheets

SEMICONDUCTOR DEVICE

CROSS-REFERENCE TO RELATED APPLICATIONS

This application is based upon and claims the benefit of priority from prior Japanese Patent Application No. 2004-018535, filed Jan. 27, 2004, the entire contents of which are incorporated herein by reference.

BACKGROUND OF THE INVENTION

1. Field of the Invention

The present invention relates to a semiconductor device incorporating a semiconductor constructing body.

2. Description of the Related Art

The conventional semiconductor device disclosed in Jpn. Pat. Appln. KOKAI Publication No. 2003-298005 includes solder balls as connecting terminals for external connection outside a silicon substrate. Therefore, this semiconductor device has a structure in which a silicon substrate having a plurality of connecting pads on its upper surface is formed on the upper surface of a base plate, an insulating layer is formed on the upper surface of the base plate around the silicon substrate, an upper insulating film is formed on the upper surfaces of the silicon substrate and insulating layer, upper interconnections are formed on the upper surface of the upper insulating film and connected to the connecting pads of the silicon substrate, portions except for connecting pad portions of the upper interconnections are covered with an uppermost insulating film, and solder balls are formed on the connecting pad portions of the upper interconnections.

In this conventional semiconductor device, the insulating layer formed on the upper surface of the base plate around the silicon substrate is literally an insulating layer. Therefore, when the planar size of the whole semiconductor device is to be increased by increasing the planar size of this insulating layer, the insulating layer forms a large dead space.

BRIEF SUMMARY OF THE INVENTION

It is, therefore, an object of the present invention to provide a semiconductor device capable of reducing a dead space formed around a semiconductor substrate such as a silicon substrate.

According to an aspect of the present invention, there is provided a semiconductor device comprising:

a base member;

a semiconductor constructing body formed on the base member, and having a semiconductor substrate and a plurality of external connecting electrodes formed on the semiconductor substrate;

a wiring board formed around the semiconductor constructing body, and having first interconnections on at least a surface thereof; and second interconnections formed on the semiconductor constructing body and wiring board, and electrically connected to the external connecting electrodes of the semiconductor constructing body.

In the semiconductor device of this aspect, the wiring board is formed around the semiconductor substrate and the semiconductor constructing body having the external connecting electrodes. Accordingly, a dead space formed around the semiconductor substrate can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE INVENTION

FIRST EMBODIMENT

Figure 1:
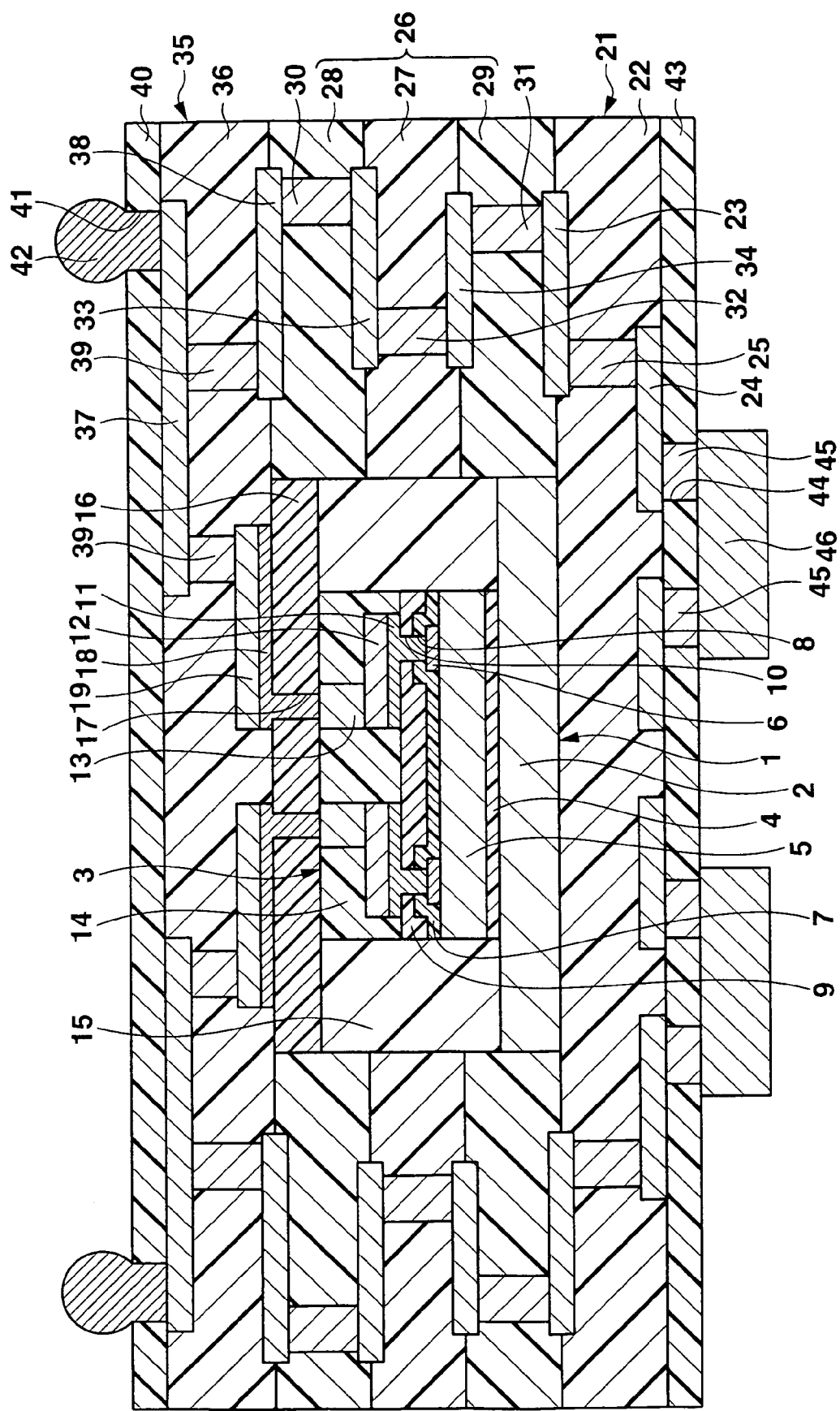
FIG. 1 is a sectional view of a semiconductor device according to the first embodiment of the present invention.

FIG. 1 is a sectional view of a semiconductor device according to the first embodiment of the present invention. This semiconductor device includes a semiconductor block 1. The semiconductor block 1 will be briefly explained below. The semiconductor block 1 has a support plate 2, semiconductor constructing body 3, insulating layer 15, upper insulating film 16, and upper interconnections 19 (second interconnections). That is, the semiconductor block 1 includes the support plate 2 having a square planar shape. The support plate 2 can be any of an insulating plate made of, e.g., resin, silicon, or ceramics, a metal plate such as a copper foil, or a prepreg material or buildup material (to be described later).

The lower surface of the semiconductor constructing body 3 having a square planar shape and a size smaller to a certain degree than the size of the support plate 2 is fixed to the upper surface of the support plate 2 via an adhesive layer 4 made of a die bonding material. The semiconductor constructing body 3 has interconnections 12, columnar electrodes 13, and a sealing film 14 (all of which will be explained later), and is generally called a CSP (Chip Size Package). Since the individual semiconductor constructing bodies 3 are obtained by dicing after the interconnections 12, columnar electrodes 13, and sealing film 14 are formed on a silicon wafer as will be described later, the semiconductor constructing body 3 is also particularly called a wafer level CSP (W-CSP). The structure of the semiconductor constructing body 3 will be explained below.

The semiconductor constructing body 3 includes a silicon substrate (semiconductor substrate) 5 having a square planar shape. The lower surface of the silicon substrate 5 is adhered to the support plate 2 via the adhesive layer 4. An integrated circuit (not shown) having a predetermined function is formed on the upper surface of the silicon substrate 5. A plurality of connecting pads 6 made of, e.g., an aluminum-based metal are formed on the periphery of the upper surface of the substrate 5 and connected to the integrated circuit. An insulating film 7 made of silicon oxide or the like is formed on the upper surface of the silicon substrate 5 and connecting pads 6 except for central portions of the pads 6. These central portions of the connecting pads 6 are exposed through holes 8 formed in the insulating film 7.

A protective film 9 made of, e.g., an epoxy-based resin or polyimide-based resin is formed on the upper surface of the insulating film 7. Holes 10 are formed in those portions of the protective film 9, which correspond to the holes 8 in the insulating film 7. Metal undercoatings 11 made of copper or the like are formed on the upper surface of the protective film 9. The copper interconnections 12 are respectively formed on the entire upper surfaces of the metal undercoatings 11. One end portion of each metal undercoating 11 is electrically connected to the connecting pad 6 through the holes 8 and 10.

The columnar electrodes (external connecting electrodes) 13 made of copper are formed on the upper surfaces of connecting pad portions of the interconnections 12. The sealing film 14 made of, e.g., an epoxy-based resin or polyimide-based resin is formed on the upper surface of the protective film 9 including the interconnections 12, such that the upper surface of the sealing film 14 is leveled with the upper surfaces of the columnar electrodes 13. As described above, the semiconductor constructing body 3 called a W-CSP includes the silicon substrate 5, connecting pads 6, and insulating film 7, and also includes the protective film 9, interconnections 12, columnar electrodes 13, and sealing film 14.

The square frame-like insulating layer 15 is formed on the upper surface of the support plate 2 around the semiconductor constructing body 3, such that the upper surface of the insulating layer 15 is substantially leveled with the upper surface of the semiconductor constructing body 3. The insulating layer 15 is made of a thermosetting resin such as an epoxy-based resin or polyimide-based resin, or a material obtained by mixing, in a thermosetting resin like this, a reinforcing material such as glass fibers or a silica filler.

On the upper surfaces of the semiconductor constructing body 3 and insulating layer 15, the upper insulating film 16 is formed to have a flat upper surface. The upper insulating film 16 is usually called a buildup material for use in a multilayered circuit board, and formed by, e.g., mixing a reinforcing material such as glass fibers or a silica filler in a thermosetting resin such as an epoxy-based resin or BT resin. Holes 17 are formed in those portions of the upper insulating film 16, which correspond to the central portions of the upper surfaces of the columnar electrodes 13.

Upper metal undercoatings 18 made of copper or the like are formed on the upper surface of the upper insulating film 16. The upper interconnections 19 made of copper are respectively formed on the entire upper surfaces of the upper metal undercoatings 18. One end portion of each upper metal undercoating 18 is connected to the upper surface of the columnar electrode 13 through the hole 17 in the upper insulating film 16. As described above, the semiconductor block 1 includes the support plate 2, semiconductor constructing body 3, insulating layer 15, upper insulating film 16, and upper interconnections 19.

The support plate 2 of the semiconductor block 1 is fixed to a predetermined portion on the upper surface of a lower wiring board (base member) 21 having a square planar shape. The lower wiring board 21 has a structure in which upper-surface interconnections (third interconnections) 23 formed on the upper surface of an insulating substrate (base member) 22 and lower-surface interconnections (third interconnections) 24 formed on the lower surface of the insulating substrate 22 are connected via vias 25 formed in the insulating substrate 22. The insulating substrate 22 is made of a material, which is usually called a prepreg material, obtained by impregnating a base such as glass cloth or aramid fibers with a thermosetting resin such as an epoxy-based resin. However, a buildup material may also be used. The upper-surface interconnections 23 and lower-surface interconnections 24 are made of a copper foil. The vias 25 are made of, e.g., metal paste or conductive resin paste.

A square frame-like intermediate wiring board 26 is formed on the upper surface of the lower wiring board 21 around the semiconductor block 1, such that the upper surface of the intermediate wiring board 26 is substantially leveled with the upper surface of the semiconductor constructing body 3. The intermediate wiring board 26 is a multilayered wiring board, and has a structure in which, e.g., second and third insulating substrates 28 and 29 are stacked on the upper and lower surfaces, respectively, of a first insulating substrate 27, and vias 30 formed in the second insulating substrate 28 and vias 31 formed in the third insulating substrate 29 are connected via vias 32 formed in the first insulating substrate 27 and via upper-surface interconnections (first interconnections) 33 and lower-surface interconnections (first interconnections) 34 formed on the upper and lower surfaces, respectively, of the first insulating substrate 27.

In this structure, the first to third insulating substrates 27 to 29 are made of the same prepreg material or buildup material as the insulating substrate 22 of the lower wiring board 21. The upper-surface interconnections 33 and lower-surface interconnections 34 are made of a copper foil. The vias 25 are made of metal paste or conductive resin paste. The vias 31 of the third insulating substrate 29 are connected to the upper-surface interconnections 23 of the lower wiring board 21.

An upper wiring board 35 is formed on the upper surfaces of the semiconductor block 1 and intermediate wiring board 26. The upper wiring board 35 has a structure in which upper-surface interconnections 37 (fourth interconnections) formed on the upper surface of an insulating substrate 36 and lower-surface interconnections (fourth interconnections) 38 formed on the lower surface of the insulating substrate 36 are electrically connected via vias 39 formed in the insulating substrate 36. In this structure, the insulating substrate 36 is made of the same prepreg material or buildup material as the insulating substrate 22 of the lower wiring board 21. The upper-surface interconnections 37 and lower-surface interconnections 38 are made of a copper foil. The vias 39 are made of metal paste or conductive resin paste.

The lower-surface interconnections 38 of the upper wiring board 35 are electrically connected to the vias 30 formed in the second insulating substrate 28 of the intermediate wiring board 26. Some of the vias 39 formed below the upper-surface interconnections 37 of the upper wiring board 35 are not connected to the lower-surface interconnections 38, but connected to the connecting pad portions of the upper interconnections 19 of the semiconductor block 1.

An upper overcoat film 40 made of a solder resist or the like is formed on the upper surface of the upper wiring board 35. Holes 41 are formed in those portions of the upper overcoat film 40, which correspond to connecting pad portions of the upper-surface interconnections 37 of the upper wiring board 35. Solder balls 42 are provided in and above the holes 41 and electrically connected to the connecting pad portions of the upper-surface interconnections 37 of the upper wiring board 35. The solder balls 42 are arranged in a matrix on the upper surface of the upper overcoat film 40.

A lower overcoat film 43 made of a solder resist or the like is formed on the lower surface of the lower wiring board 21. Holes 44 are formed in those portions of the lower overcoat film 43, which correspond to connecting pad portions of the lower-surface interconnections 24 of the lower wiring board 21. A conductive connecting portion 45 made of, e.g., metal paste or conductive resin paste is formed in each hole 44. A chip part (electronic part) 46 such as a capacitor or resistor is formed on the lower surface of the lower overcoat film 43, such that electrodes on the two sides of the chip part 46 are connected to the conductive connecting portions 45.

In the semiconductor block 1, the area size of the support plate 2 is made larger to some extent than that of the semiconductor constructing body 3, in order to make the planar size of the formation region of the connecting pad portions of the upper interconnections 19 larger to a certain degree than that of the semiconductor constructing body 3 in accordance with the increase in number of the connecting pads 6 on the silicon substrate 5, thereby making the size and pitch of the connecting pad portions of the upper interconnections 19 larger than those of the columnar electrodes 13.

Accordingly, those connecting pad portions of the upper interconnections 19, which are arranged in a matrix, are formed not only in a region vertically corresponding to the semiconductor constructing body 3, but also in a region corresponding to the insulating layer 15 formed outside the side surfaces of the semiconductor constructing body 3. That is, of those connecting pad portions of the upper interconnections 19, which are arranged in a matrix, at least some or all outermost connecting pad portions are formed in a periphery positioned outside the semiconductor constructing body 3.

In this semiconductor device, the square frame-like intermediate wiring board 26 is formed on the upper surface of the lower wiring board 21 horizontally enclosing the semiconductor block 1 having the silicon substrate 5. Therefore, even when the planar size of the whole semiconductor device is increased to some extent, a dead space formed around the silicon substrate 5 can be reduced.

Also, in this semiconductor device, the square or rectangular frame-like intermediate wiring board 26 is formed on the upper surface of the lower wiring board 21 around the semiconductor block 1. Accordingly, a high-density wiring structure can be obtained compared to a device in which a simple insulating layer is formed instead of the intermediate wiring board 26. That is, if a simple insulating layer is formed instead of the intermediate wiring board 26, through holes are formed in this insulating layer, and the upper wiring board 35 and lower wiring board 21 are simply connected. As a consequence, no high-density wiring structure can be obtained.

Figure 2:
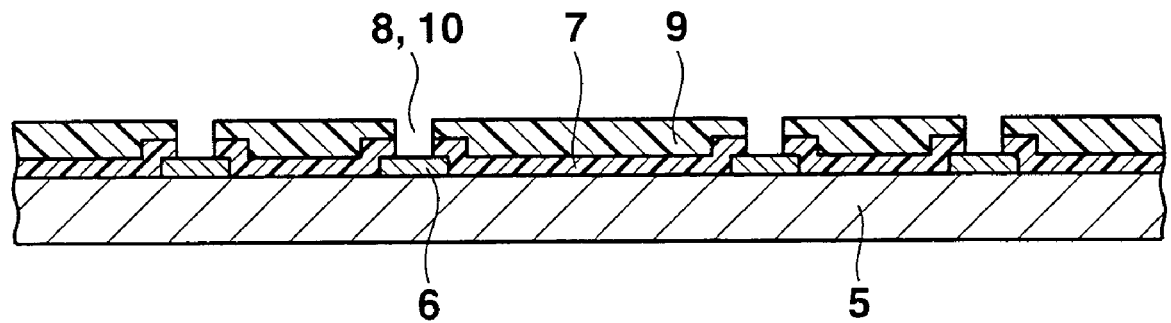
FIG. 2 is a sectional view of an assembly initially prepared when the semiconductor device shown in FIG. 1 is fabricated.

An example of a method of fabricating this semiconductor device will be described below. First, an example of the fabrication method of the semiconductor constructing body 3 will be explained. In this method, an assembly as shown in FIG. 2 is first prepared. In this assembly, connecting pads 6 made of, e.g., an aluminum-based metal, an insulating film 7 made of, e.g., silicon oxide, and a protective film 9 made of, e.g., an epoxy-based resin or polyimide-based resin are formed on a wafer-like silicon substrate (semiconductor substrate) 5. Central portions of the connecting pads 6 are exposed through holes 8 and 10 formed in the insulating film 7 and protective film 9. In the wafer-like silicon substrate 5 having this structure, an integrated circuit having a predetermined function is formed in a region where each semiconductor constructing body is to be formed, and each connecting pad 6 is electrically connected to the integrated circuit formed in the corresponding region.

Figure 3:
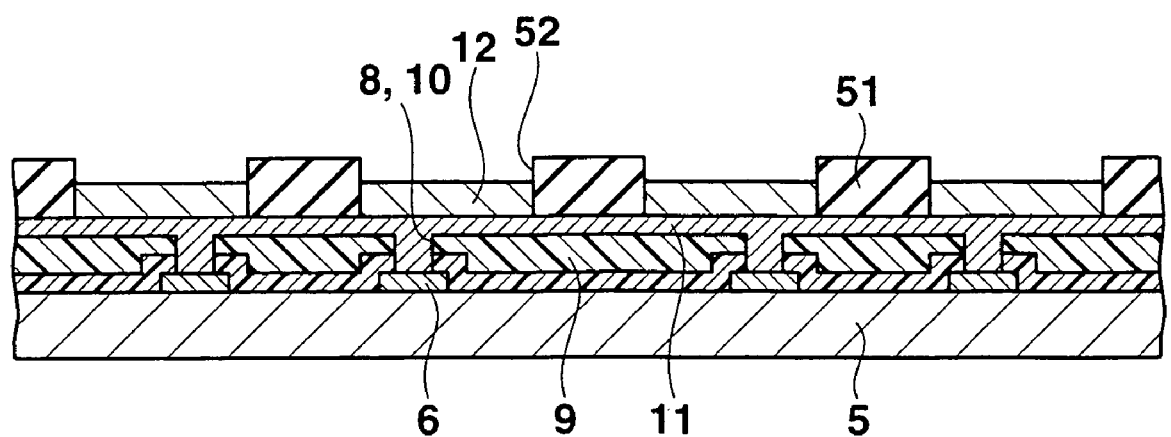
FIG. 3 is a sectional view of a step following FIG. 2.

As shown in FIG. 3, a metal undercoating 11 is formed on the entire upper surface of the protective film 9 and the upper surfaces of the connecting pads 6 exposed through the holes 8 and 10. The metal undercoating 11 may be any of a copper layer formed by electroless plating, a copper layer formed by sputtering, and a combination of a thin film of titanium or the like formed by sputtering and a copper layer formed on this thin film by sputtering. This similarly applies to an upper metal undercoating 18 (to be described later).

A plating resist film 51 is formed by patterning on the upper surface of the metal undercoating 11. In this state, holes 52 are formed in those portions of the plating resist film 51, which correspond to regions where interconnections 12 are to be formed. Electroless plating of copper is then performed by using the metal undercoating 11 as a plating current path, thereby forming interconnections 12 on the upper surface of the metal undercoating 11 in the holes 52 of the plating resist film 51. After that, the plating resist film 51 is removed.

Figure 4:
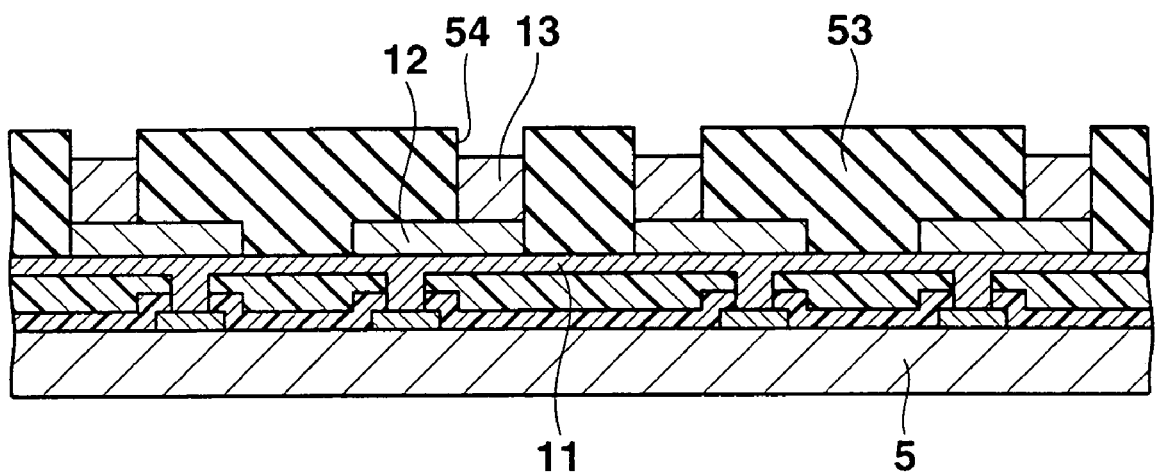
FIG. 4 is a sectional view of a step following FIG. 3.
Figure 5:
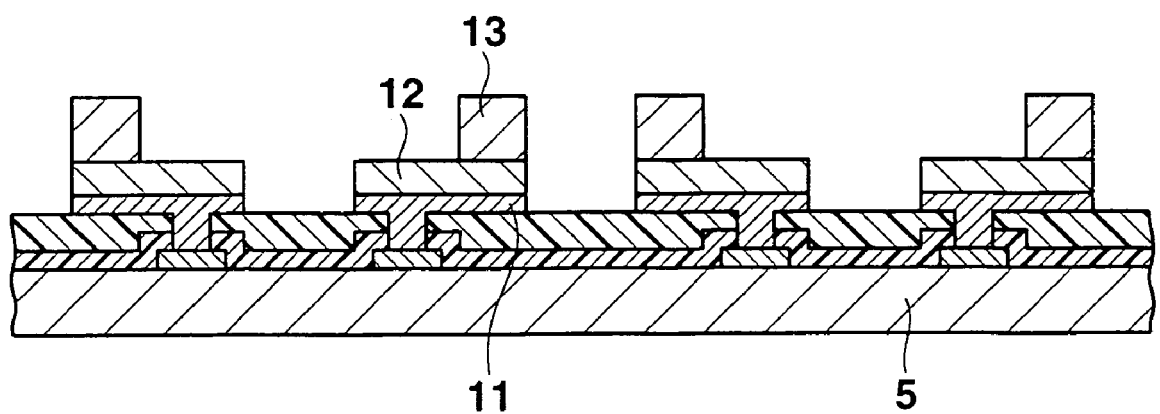
FIG. 5 is a sectional view of a step following FIG. 4.

As shown in FIG. 4, a plating resist film 53 is formed by patterning on the upper surface of the metal undercoating 11 including the interconnections 12. In this state, holes 54 are formed in those portions of the plating resist film 53, which correspond to regions where columnar electrodes 13 are to be formed. Electroless plating of copper is then performed by using the metal undercoating 11 as a plating current path, thereby forming columnar electrodes 13 on the upper surfaces of connecting pad portions of the interconnections 12 in the holes 54 of the plating resist film 53. After that, the plating resist film 53 is removed, and unnecessary portions of the metal undercoating 11 are etched away by using the interconnections 12 as masks. Consequently, as shown in FIG. 5, the metal undercoating 11 remains only below the interconnections 12.

Figure 6:
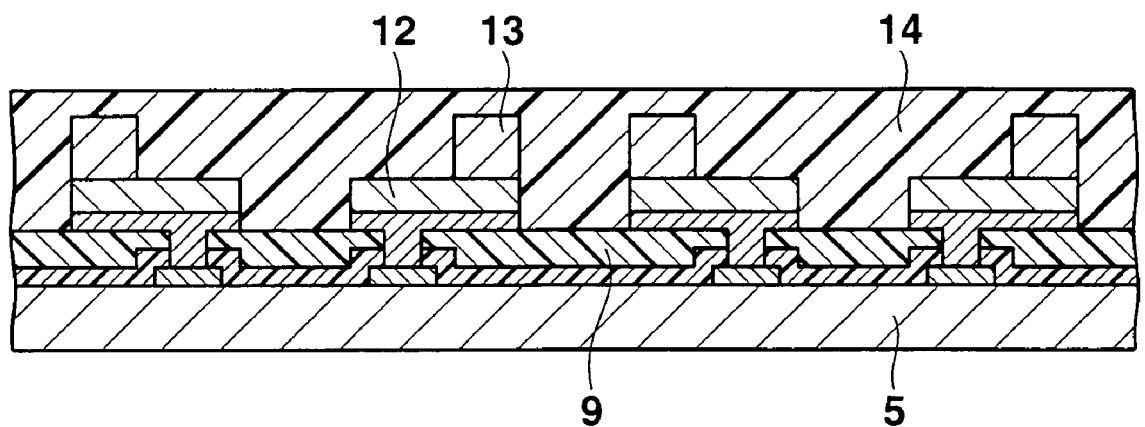
FIG. 6 is a sectional view of a step following FIG. 5.

As shown in FIG. 6, a sealing film 14 made of, e.g., an epoxy-based resin or polyimide-based resin is formed on the entire upper surface of the protective film 9 including the columnar electrodes 13 and interconnections 12 by, e.g., screen printing, spin coating, or die coating, such that the thickness of the sealing film 14 is larger than the height of the columnar electrodes 13. In this state, therefore, the upper surfaces of the columnar electrodes 13 are covered with the sealing film 14.

Figure 7:
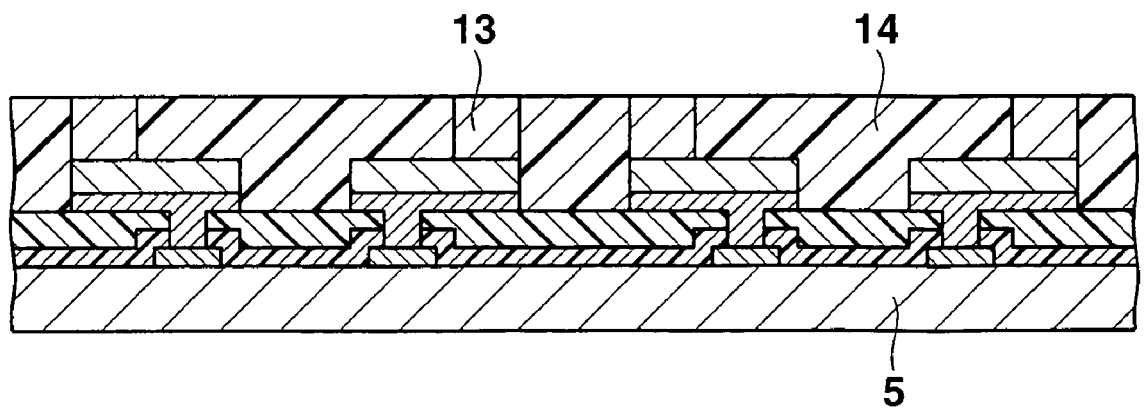
FIG. 7 is a sectional view of a step following FIG. 6.

As shown in FIG. 7, the sealing film 14 and the upper surfaces of the columnar electrodes 13 are properly polished to expose the upper surfaces of the columnar electrodes 13, and planarize the upper surface of the sealing film 14 including those exposed upper surfaces of the columnar electrodes 13. The upper surfaces of the columnar electrodes 13 are thus properly polished in order to make the heights of the columnar electrodes 13 uniform by eliminating variations in height of the columnar electrodes 13 formed by electroless plating.

Figure 8:
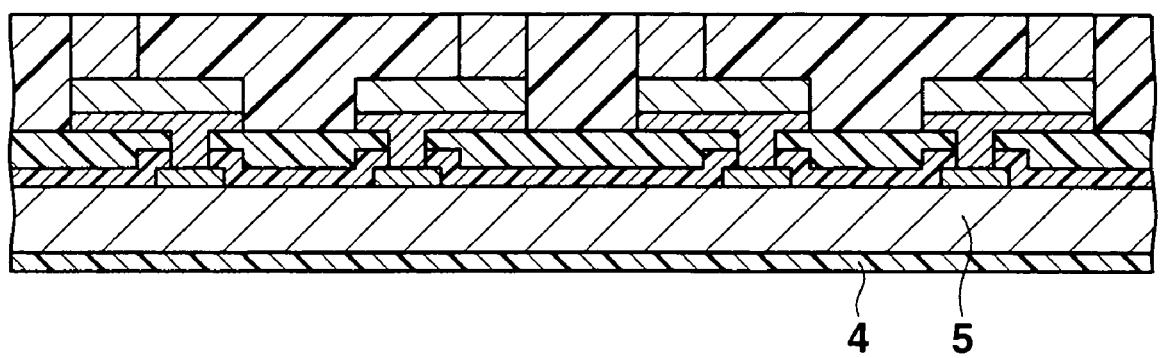
FIG. 8 is a sectional view of a step following FIG. 7.
Figure 9:
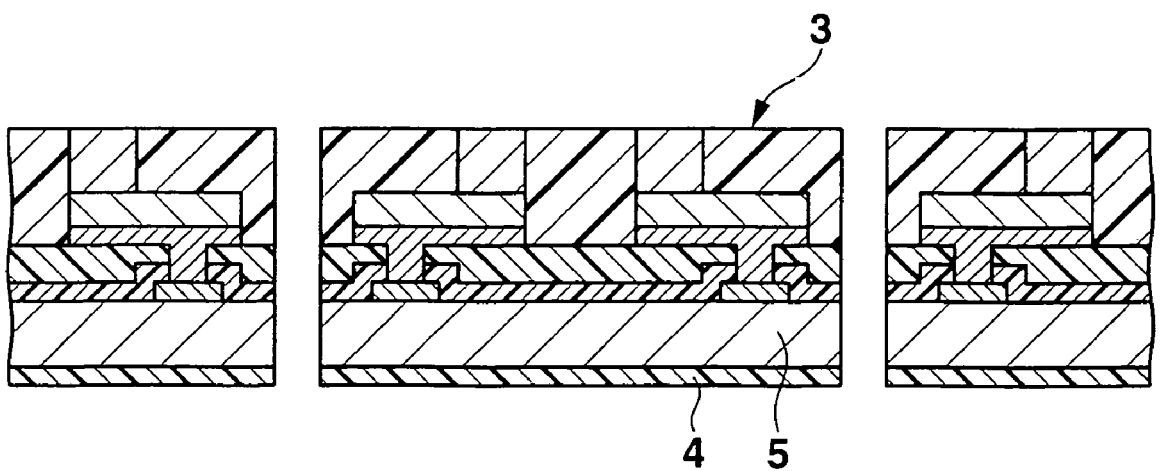
FIG. 9 is a sectional view of a step following FIG. 8.

As shown in FIG. 8, an adhesive layer 4 is adhered to the entire upper surface of the silicon substrate 5. The adhesive layer 4 is made of a die bonding material such as an epoxy-based resin or polyimide-based resin, and fixed, in a semi-hardened state, to the silicon substrate 5 by heating and pressing. Then, the adhesive layer 4 fixed to the silicon substrate 5 is adhered to a dicing tape (not shown), and removed from the dicing tape after a dicing step shown in FIG. 9 is performed. Consequently, as shown in FIG. 1, a plurality of semiconductor constructing bodies 3 each having the adhesive layer 4 on the lower surface of the silicon substrate 5 are obtained.

The semiconductor constructing body 3 thus obtained has the adhesive layer 4 on the lower surface of the silicon substrate 5. This obviates the need for a very cumbersome operation of forming an adhesive layer on the lower surface of the silicon substrate 5 of each semiconductor constructing body 3 after the dicing step. The operation of removing the dicing tape after the dicing step is much easier than the operation of forming an adhesive layer on the lower surface of the silicon substrate 5 of each semiconductor constructing body 3 after the dicing step.

Figure 10:
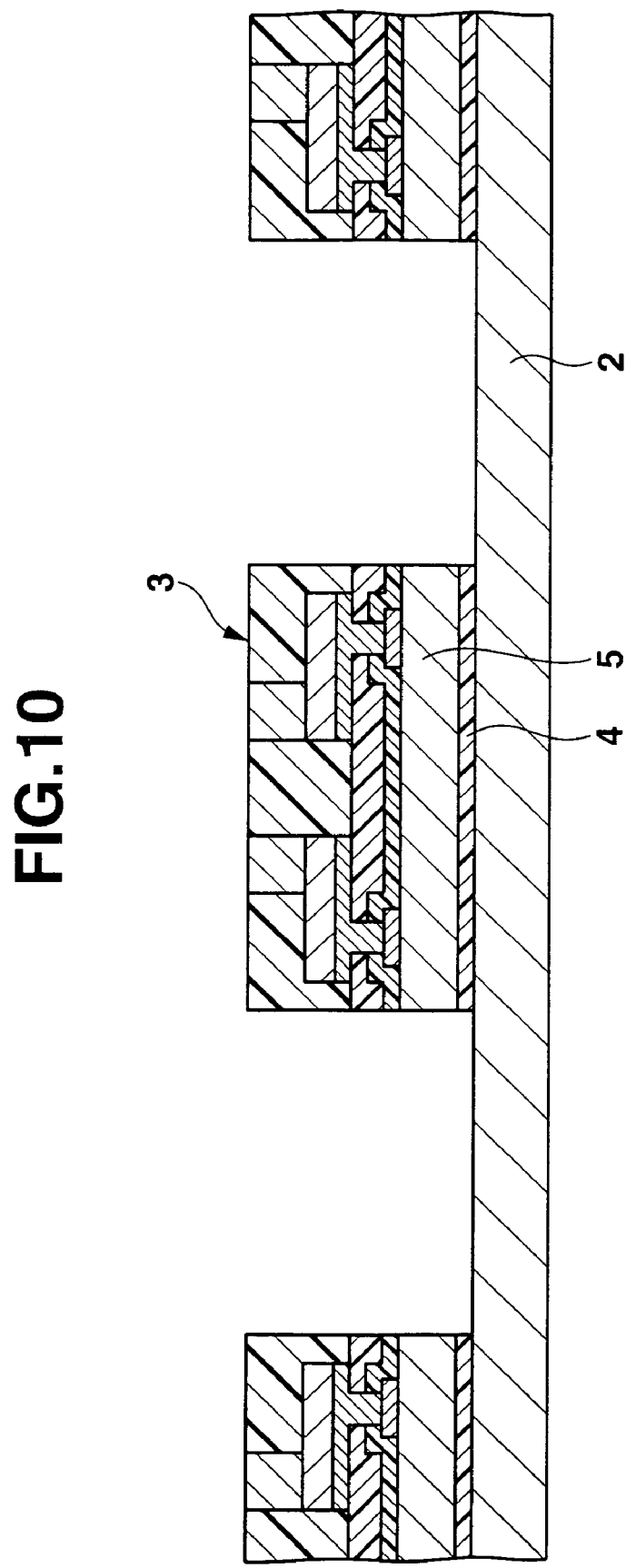
FIG. 10 is a sectional view of a step following FIG. 9.

An example of a method of fabricating the semiconductor block 1 shown in FIG. 1 by using the semiconductor constructing body 3 thus obtained will be described below. First, a support plate 2 as shown in FIG. 10 is prepared. The support plate 2 has a size capable of forming a plurality of support plates 2 shown in FIG. 1, and has a square planar shape, although the shape is not particularly limited. Then, the adhesive layers 4 adhered to the lower surfaces of the silicon substrates 5 of the semiconductor constructing bodies 3 are adhered to a plurality of predetermined portions on the upper surface of the support plate 2. In this adhesion, the adhesive layers 4 are finally hardened by heating and pressing.

Figure 11:
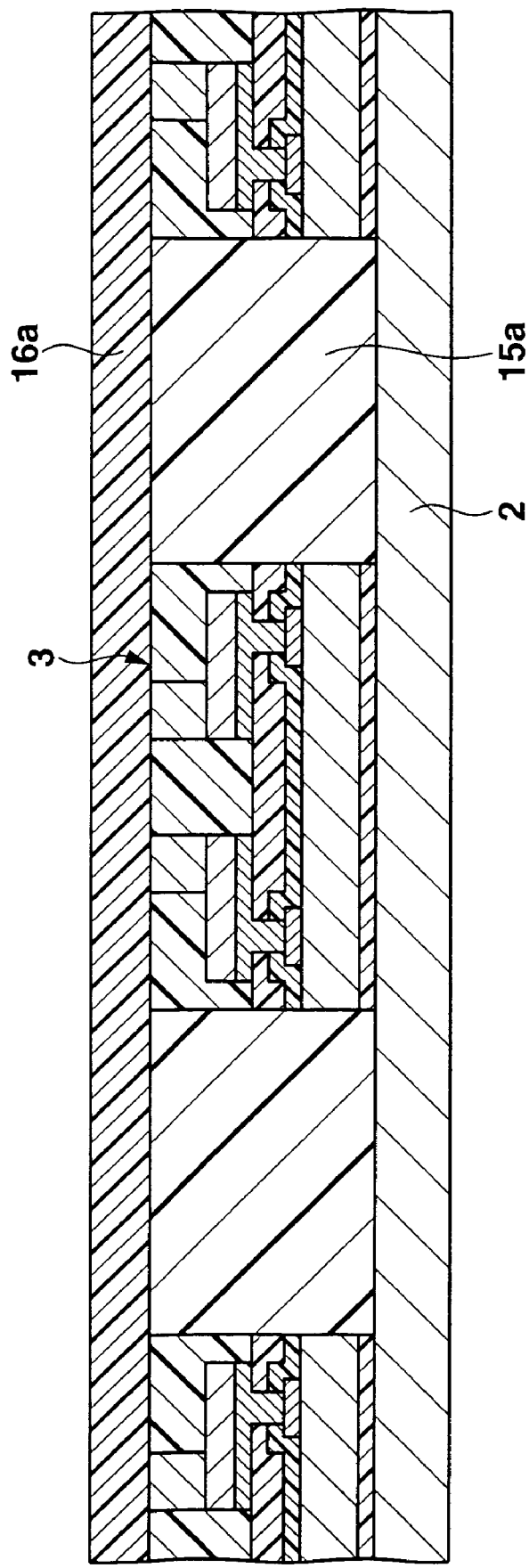
FIG. 11 is a sectional view of a step following FIG. 10.

As shown in FIG. 11, an insulating layer formation layer 15a is formed on the upper surface of the support plate 2 around the semiconductor constructing body 3 by, e.g., screen printing or spin coating. The insulating layer formation layer 15a is made of, e.g., a thermosetting resin such as an epoxy-based resin or polyimide-based resin, or a material obtained by mixing, in a thermosetting resin like this, a reinforcing material such as glass fibers or a silica filler.

Subsequently, an upper insulating film formation sheet 16a is placed on the upper surfaces of the semiconductor constructing body 3 and insulating layer formation layer 15a. The upper insulating film formation sheet 16a is preferably made of a sheet-like buildup material, although the material is not particularly limited. For example, this buildup material is obtained by mixing a silica filler in a thermosetting resin such as an epoxy-based resin, and semi-hardening the thermosetting resin. Note that it is also possible to use, as the upper insulating film formation sheet 16a, a prepreg material obtained by impregnating woven fabric or nonwoven fabric made of an inorganic material such as glass with a thermosetting resin such as an epoxy-based resin, and semi-hardening the thermosetting resin into the form of a sheet, or a sheet made only of a thermosetting resin in which no silica filler is mixed.

Figure 12:
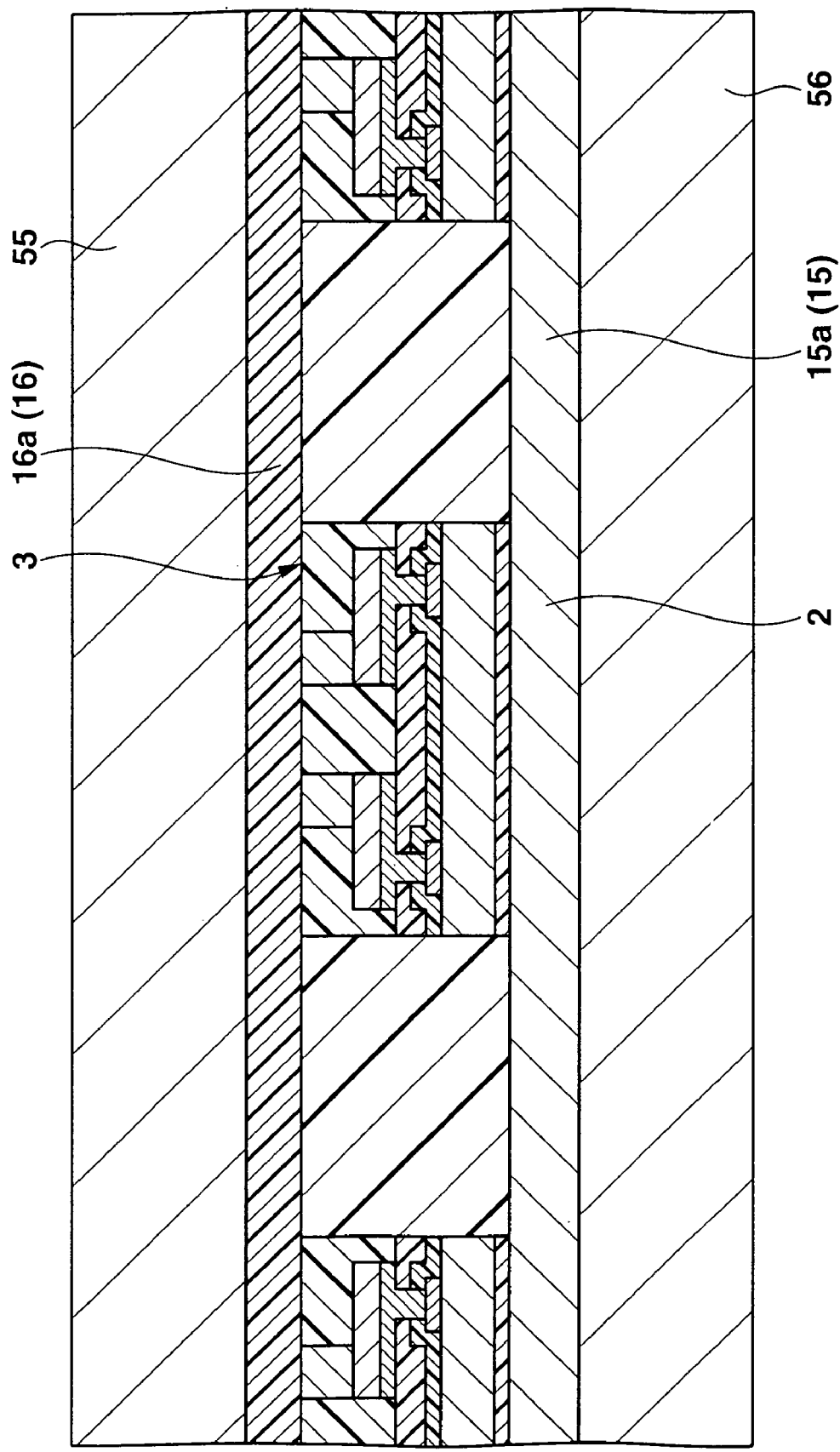
FIG. 12 is a sectional view of a step following FIG. 11.

As shown in FIG. 12, a pair of heating/pressing plates 55 and 56 are used to heat and press, from above and below, the insulating layer formation layer 15a and upper insulating film formation sheet 16a. Consequently, an insulating layer 15 is formed on the upper surface of the support plate 2 around the semiconductor constructing body 3, and an upper insulating film 16 is formed on the upper surfaces of the semiconductor constructing body 3 and insulating layer 15. In this state, the upper surface of the upper insulating film 16 is a flat surface because it is pressed by the lower surface of the upper heating/pressing plate 55. Accordingly, no polishing step of planarizing the upper surface of the upper insulting film 16 is necessary.

Figure 13:
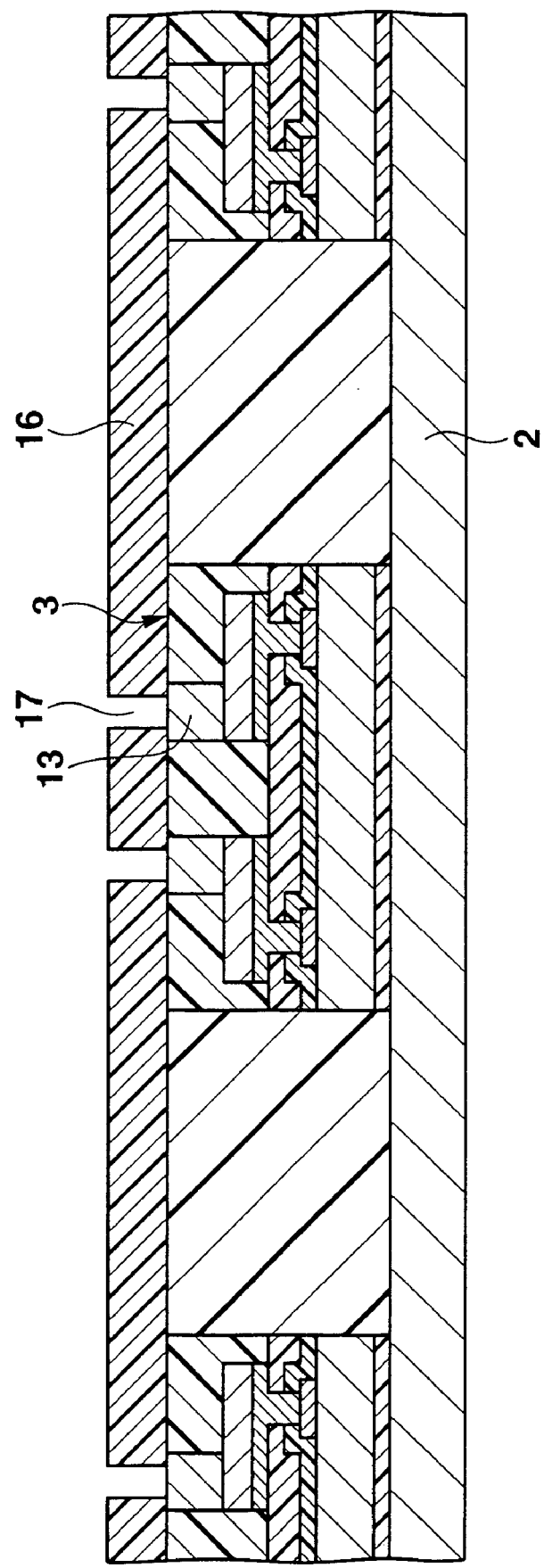
FIG. 13 is a sectional view of a step following FIG. 12.
Figure 14:
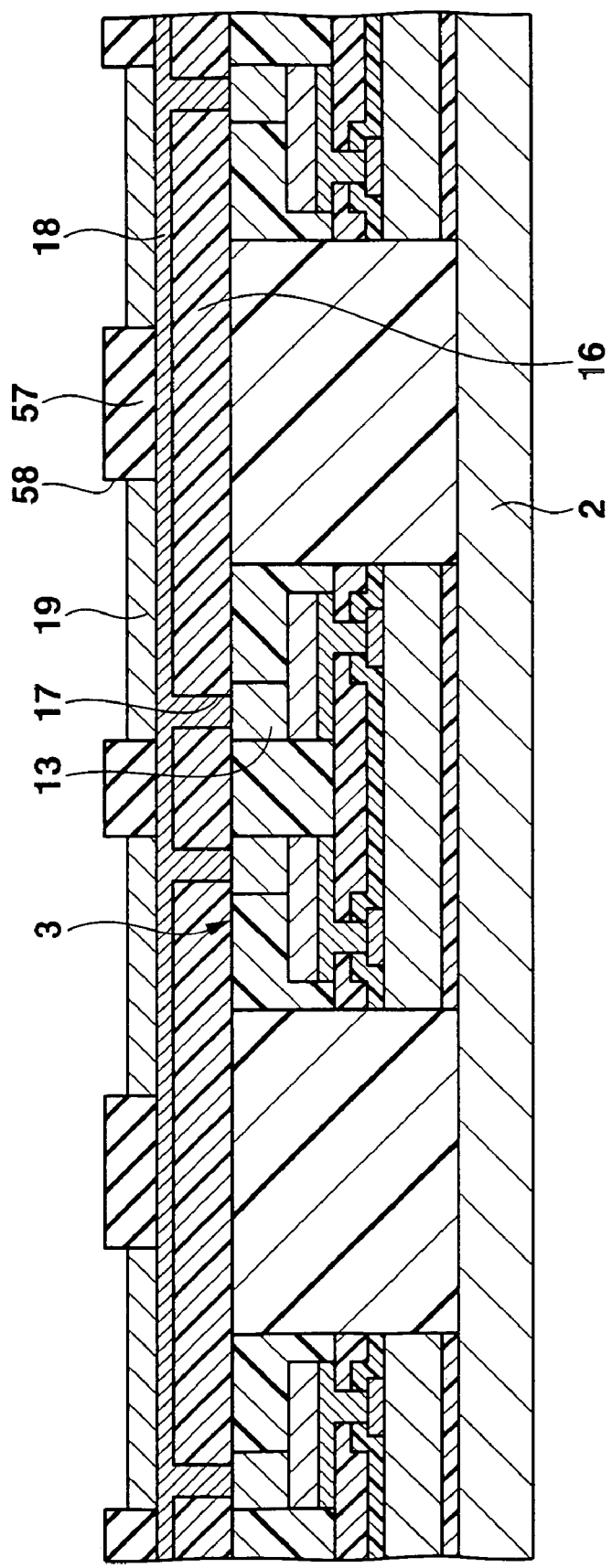
FIG. 14 is a sectional view of a step following FIG. 13.

As shown in FIG. 13, laser processing which radiates a laser beam is used to form holes 17 in those portions of the upper insulating film 16, which correspond to the central portions of the upper surfaces of the columnar electrodes 13. Then, if necessary, epoxy smear and the like occurring in the holes 17 and the like are removed by a desmear process. As shown in FIG. 14, an upper metal undercoating 18 is formed by electroless plating of copper on the entire upper surface of the upper insulating film 16 including the upper surfaces of the columnar electrodes 13 exposed through the holes 17. A plating resist film 57 is then formed by patterning on the upper surface of the upper metal undercoating 18. In this state, holes 58 are formed in those portions of the plating resist film 57, which correspond to formation regions of upper interconnections 19.

Figure 15:
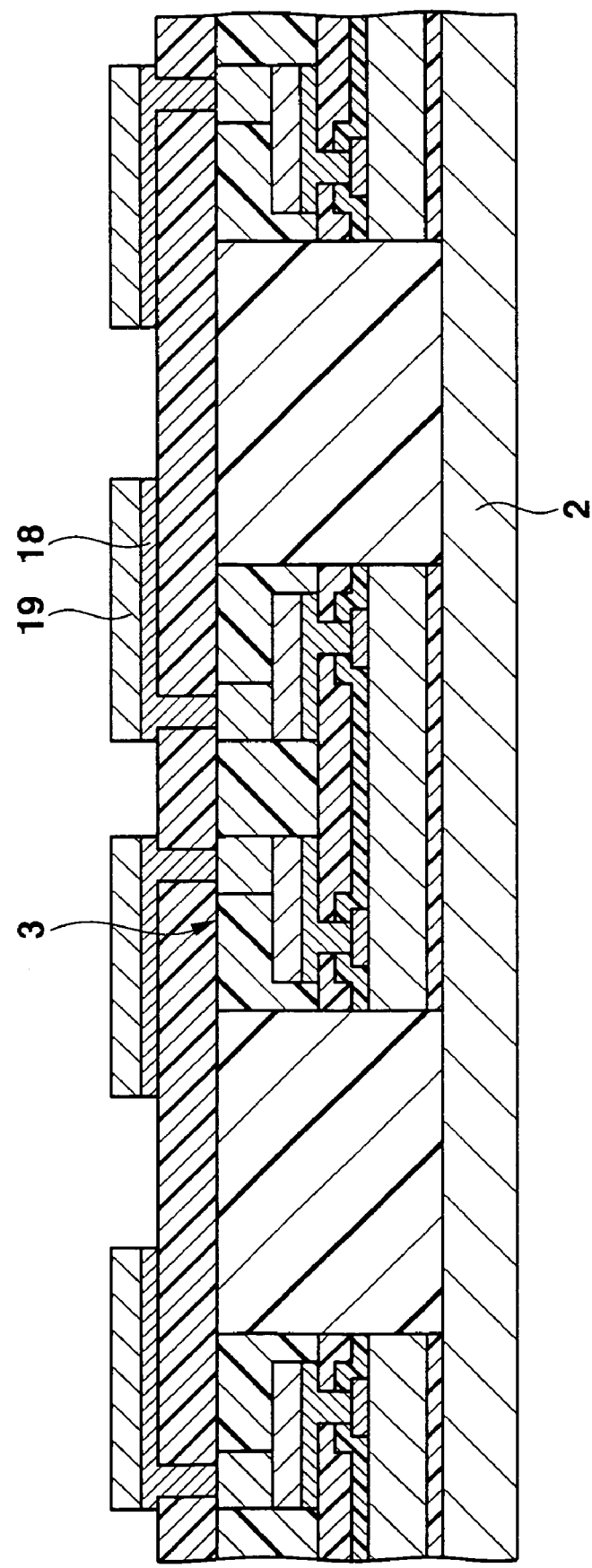
FIG. 15 is a sectional view of a step following FIG. 14.
Figure 16:
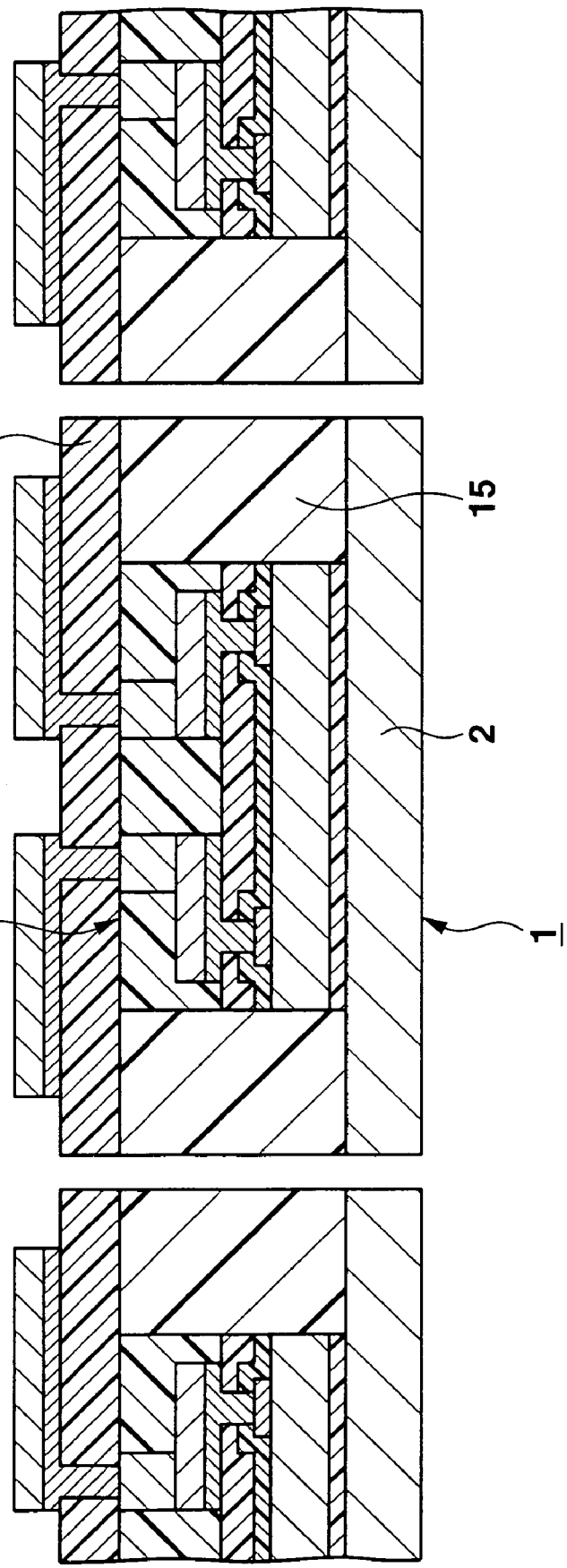
FIG. 16 is a sectional view of a step following FIG. 15.

Electroless plating of copper is then performed by using the upper metal undercoating 18 as a plating current path, thereby forming upper interconnections 19 on the upper surface of the upper metal undercoating 18 in the holes 58 of the plating resist film 57. After that, the plating resist film 57 is removed, and unnecessary portions of the upper metal undercoating 18 are etched away by using the upper interconnections 19 as masks. Consequently, as shown in FIG. 15, the upper metal undercoating 18 remains only below the upper interconnections 19. Then, as shown in FIG. 16, the upper insulating film 16, insulating layer 15, and support plate 2 are cut between the semiconductor constructing bodies 3 adjacent to each other, thereby obtaining a plurality of semiconductor blocks 1 shown in FIG. 1.

Figure 17:
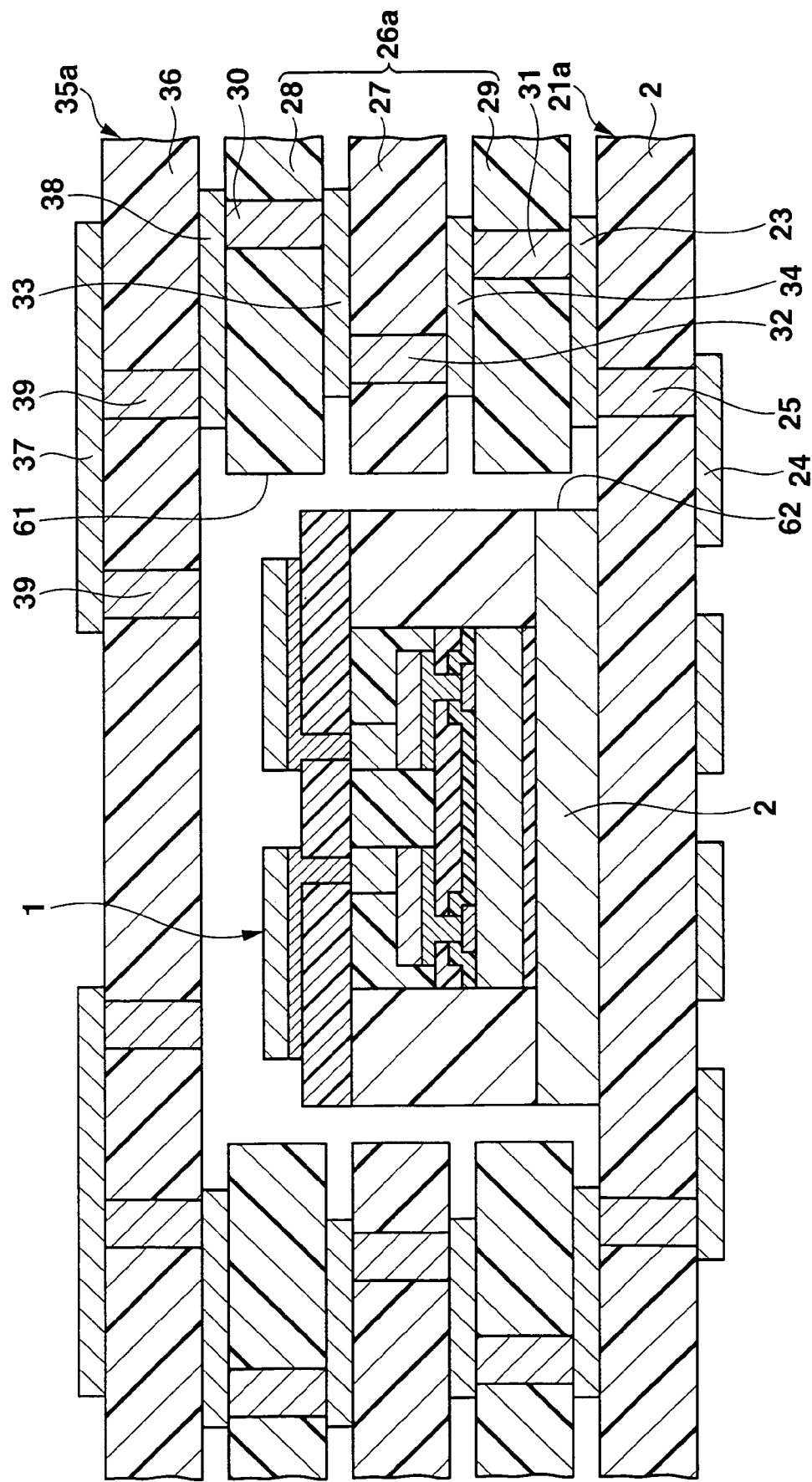
FIG. 17 is a sectional view of a step following FIG. 16.

An example of a method of fabricating the semiconductor device shown in FIG. 1 by using the semiconductor block 1 thus obtained will be explained below. First, a lower assembly wiring board 21a as shown in FIG. 17 is prepared. The lower assembly wiring board 21a has a size capable of forming a plurality of lower wiring boards 21 shown in FIG. 1, and has a square planar shape, although the shape is not particularly limited. Also, an upper assembly wiring board 35a having the same size as the lower assembly wiring board 21a is prepared. In addition, first to third insulating substrates 27 to 29 for forming an intermediate assembly wiring board 26a having the same size as the lower assembly wiring board 21a are prepared.

Since the basic structures of the assembly wiring boards 21a, 26a, and 35a are the same, an example of the formation method of the lower assembly wiring board 21a will be explained as a representative. First, a wiring substrate with a copper foil is prepared by stacking a copper foil on one or both of the upper and lower surfaces of a sheet-like insulating substrate 22 made of a prepreg material or buildup material. In this case, a thermosetting resin such as an epoxy-based resin in the insulating substrate 22 is semi-hardened. Then, via holes are formed by photolithography or laser processing which radiates a laser beam, and vias 25 are formed by filling these via holes with metal paste or the like.

In addition, the copper foil stacked on one or both of the upper and lower surfaces of the insulating substrate 22 is patterned to form upper-surface interconnections 23 and lower-surface interconnections 24. The vias 25 may also be formed by pressing pins made of a conductive material into the via holes.

As another formation method, it is also possible to first form via holes and then form upper-surface interconnections 23, lower-surface interconnections 24, and vias 25 by electroless plating and electroplating, or by sputtering and electroplating. Note that a plurality of square holes 61 are formed in the first to third insulating substrates 27 to 29 by punching, thereby giving them a lattice-like planar shape.

Then, the lower surfaces of the support plates 2 of the semiconductor blocks 1 are temporarily bonded by pressure to a plurality of predetermined portions on the upper surface of the insulating substrate 22 of the lower assembly wiring board 21a. That is, a bonding tool (not shown) having a heating mechanism is used to temporarily fix the semiconductor block 1 to each predetermined portion on the upper surface of the insulating substrate 22 containing the semi-hardened thermosetting resin, while a predetermined pressure is applied in a heated state. For example, the temporary fixing conditions are a temperature of 90° C. to 130° C. and a pressure of 0.1 to 1 Mpa.

The first to third insulating substrates 27 to 29 are arranged, as they are positioned by pins or the like, on the upper surface of the lower assembly wiring board 21a around the semiconductor block 1. In this state, the size of the hole 61 in the first to third insulating substrates 27 to 29 is larger than the size of the semiconductor block 1, so a gap 62 is formed between the hole 61 in the first to third insulating substrates 27 to 29 and the semiconductor block 1. Also, in this state, the upper surface of the second insulating substrate 28 is higher to some extent than the upper surface of the semiconductor block 1.

Then, the upper assembly wiring board 35a is placed, as it is positioned by pins or the like, on the upper surface of the second insulating substrate 28. In the above step, the semiconductor block 1 and first to third insulating substrates 27 to 29 may also be arranged in the opposite order on the lower assembly wiring board 21a. That is, it is also possible to first arrange the first to third insulating substrates 27 to 29, and then place the semiconductor block 1 in each hole 61 in the first to third insulating substrates 27 to 29.

Figure 18:
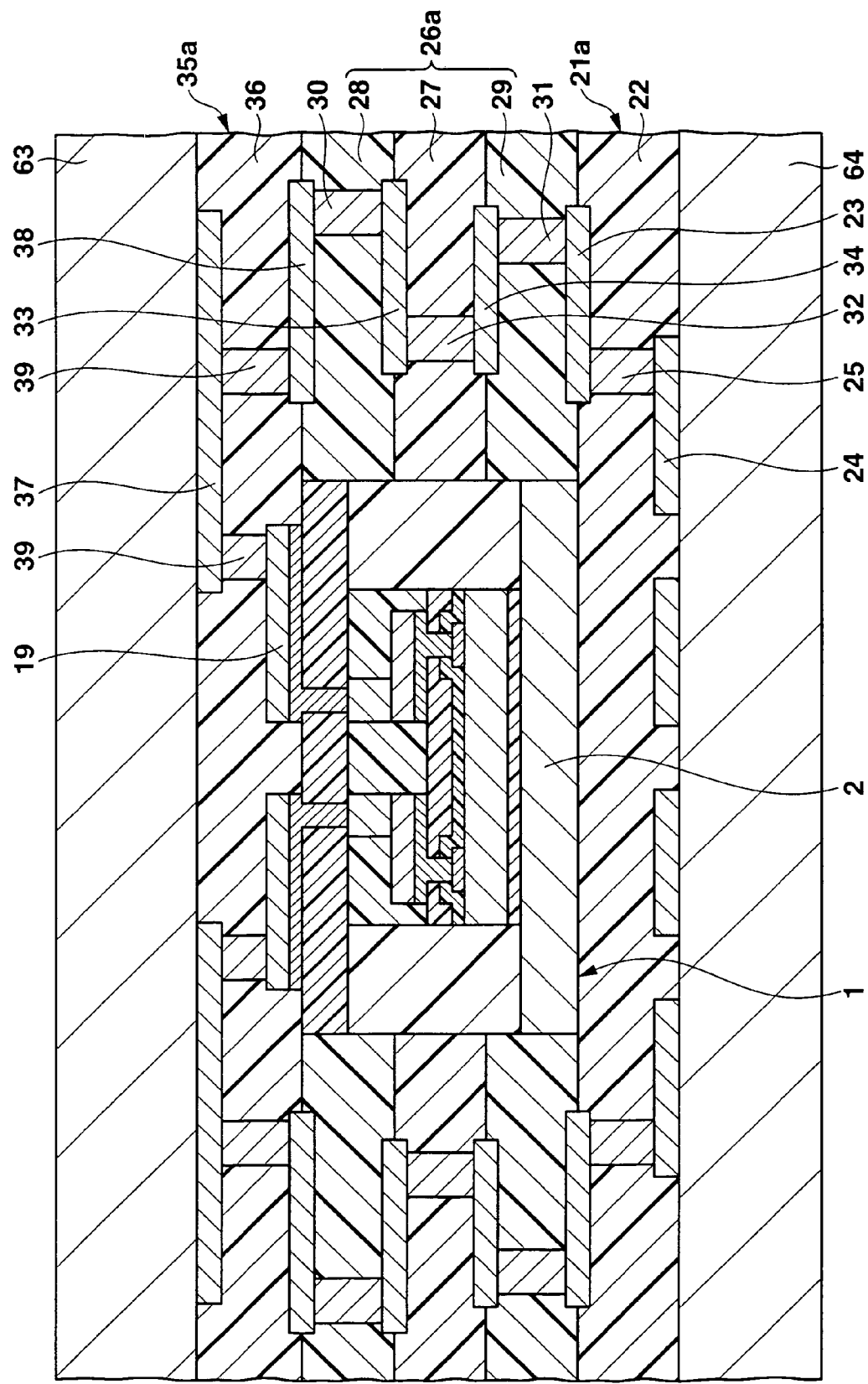
FIG. 18 is a sectional view of a step following FIG. 17.

As shown in FIG. 18, a pair of heating/pressing plates 63 and 64 are used to heat and press, from above and below, the lower assembly wiring board 21a, first to third insulating substrates 27 to 29, and upper assembly wiring board 35a. Consequently, the thermosetting resin in the insulating substrate 22 of the lower assembly wiring board 21a is cured, and the lower surface of the support plate 2 of the semiconductor block 1 is fixed to the upper surface of the insulating substrate 22.

Also, the molten thermosetting resin in the first to third insulating substrates 27 to 29 is pushed outside, and filled in the gap 62 shown in FIG. 17. This thermosetting resin is cured to integrate the first to third insulating substrate 27 to 29, thereby forming an intermediate assembly wiring board 26a which is fixed to the side surfaces of the semiconductor block 1, and to the upper surfaces of the lower assembly wiring board 21a. In addition, the thermosetting resin in the insulating substrate 36 of the upper assembly wiring board 35a is cured to fix the upper assembly wiring board 35a to the upper surfaces of the semiconductor block 1 and intermediate assembly wiring board 26a.

In this state, in the intermediate assembly wiring board 26a, vias 30 of the second insulating substrate 28 and vias 31 of the third insulating substrate 29 are connected via upper-surface interconnections 33, vias 32, and lower-surface interconnections 34 of the first insulating substrate 27. Also, the vias 31 of the third insulating substrate 29 of the intermediate assembly wiring board 26a are connected to the upper-surface interconnections 23 of the lower assembly wiring board 21a. In addition, lower-surface interconnections 38 of the upper assembly wiring board 35a are connected to the vias 30 of the second insulating substrate 28 of the intermediate assembly wiring board 26a. Furthermore, vias 39 of the upper assembly wiring board 35a are partially connected to the connecting pad portions of the upper interconnections 19 of the semiconductor block 1.

As described above, by performing heating and pressing once by using the pair of heating/pressing plates 63 and 64, the lower assembly wiring board 21a, intermediate assembly wiring board 26a, and upper assembly wiring board 35a are integrated, the semiconductor block 1 is fixed to the upper surface of the lower assembly wiring board 21a, and the side surfaces and upper surface of the semiconductor block 1 are covered with the intermediate assembly wiring board 26a and upper assembly wiring board 35a. Therefore, the number of fabricating steps can be reduced. Note that in the above formation method, it is also possible to form the intermediate assembly wiring board 26a by temporarily adhering the first to third insulating substrates 27 to 29 beforehand, placing these temporarily adhered substrates between the upper assembly wiring board 35a and lower assembly wiring board 21a, and heating and pressing the resultant structure by the pair of heating/pressing plates 63 and 64.

Figure 19:
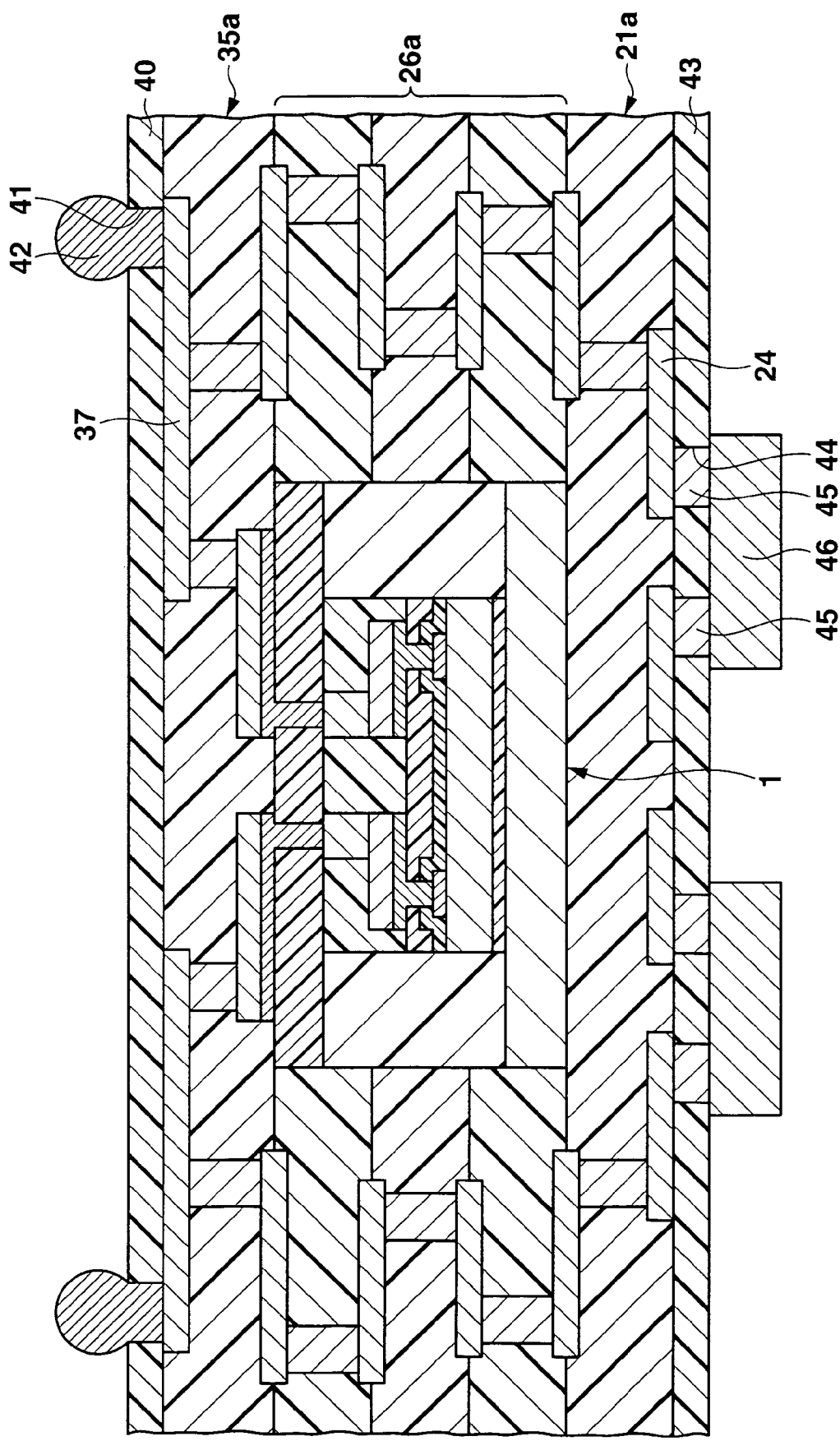
FIG. 19 is a sectional view of a step following FIG. 18.

As shown in FIG. 19, an upper overcoat film 40 made of, e.g., a solder resist is formed on the upper surface of the upper assembly wiring board 35a by, e.g., screen printing or spin coating. Also, a lower overcoat film 43 made of, e.g., a solder resist is formed on the lower surface of the lower assembly wiring board 21a. In this state, holes 41 are formed in those portions of the upper overcoat film 40, which correspond to connecting pad portions of upper-surface interconnections 37 of the upper assembly wiring board 35a. In addition, holes 44 are formed in those portions of the lower overcoat film 43, which correspond to connecting pad portions of the lower-surface interconnections 24 of the lower assembly wiring board 21a.

Then, conductive connecting portions 45 made of, e.g., metal paste are formed in the holes 44 of the lower overcoat film 43 and connected to the other end portions of the lower-surface interconnections 24. A chip part 46 such as a capacitor or resistor is formed on the lower surface of the lower overcoat film 43, such that electrodes on the two sides of the chip part 46 are connected to the conductive connecting portions 45. Solder balls 42 are then formed in and above the holes 41 of the upper overcoat film 40 and connected to the connecting pad portions of the upper-surface interconnections 37. After that, the upper overcoat film 40, upper assembly wiring board 35a, intermediate assembly wiring board 26a, lower assembly wiring board 21a, and lower overcoat film 43 are cut between the semiconductor constructing bodies 3 adjacent to each other, thereby obtaining a plurality of semiconductor devices shown in FIG. 1.

SECOND EMBODIMENT

Figure 20:
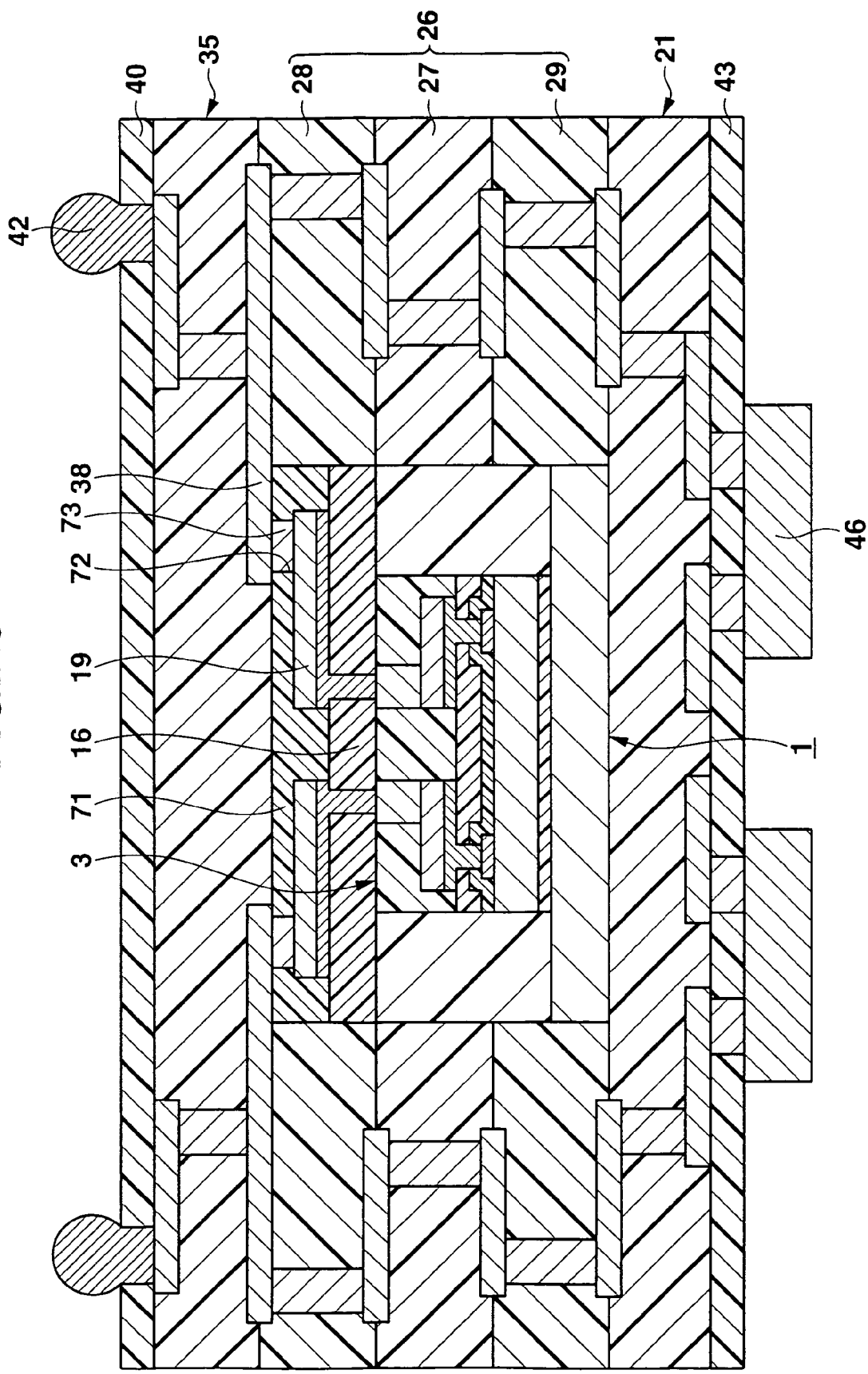
FIG. 20 is a sectional view of a semiconductor device according to the second embodiment of the present invention.

FIG. 20 is a sectional view of a semiconductor device according to the second embodiment of the present invention. This semiconductor device largely differs from that shown in FIG. 1 in that a semiconductor block 1 has a structure in which an upper overcoat layer 71 made of, e.g., a solder resist is formed on the upper surface of an upper insulating film 16 including upper interconnections 19, holes 72 are formed in those portions of the upper overcoat film 71, which correspond to connecting pad portions of the upper interconnections 19, and conductive connecting portions 73 made of, e.g., metal paste are formed in the holes 72 and connected to the connecting pad portions of the upper interconnections 19. In addition, lower-surface interconnections 38 of an upper wiring board 35 are connected to the conductive connecting portions 73 of the semiconductor block 1.

Figure 21:
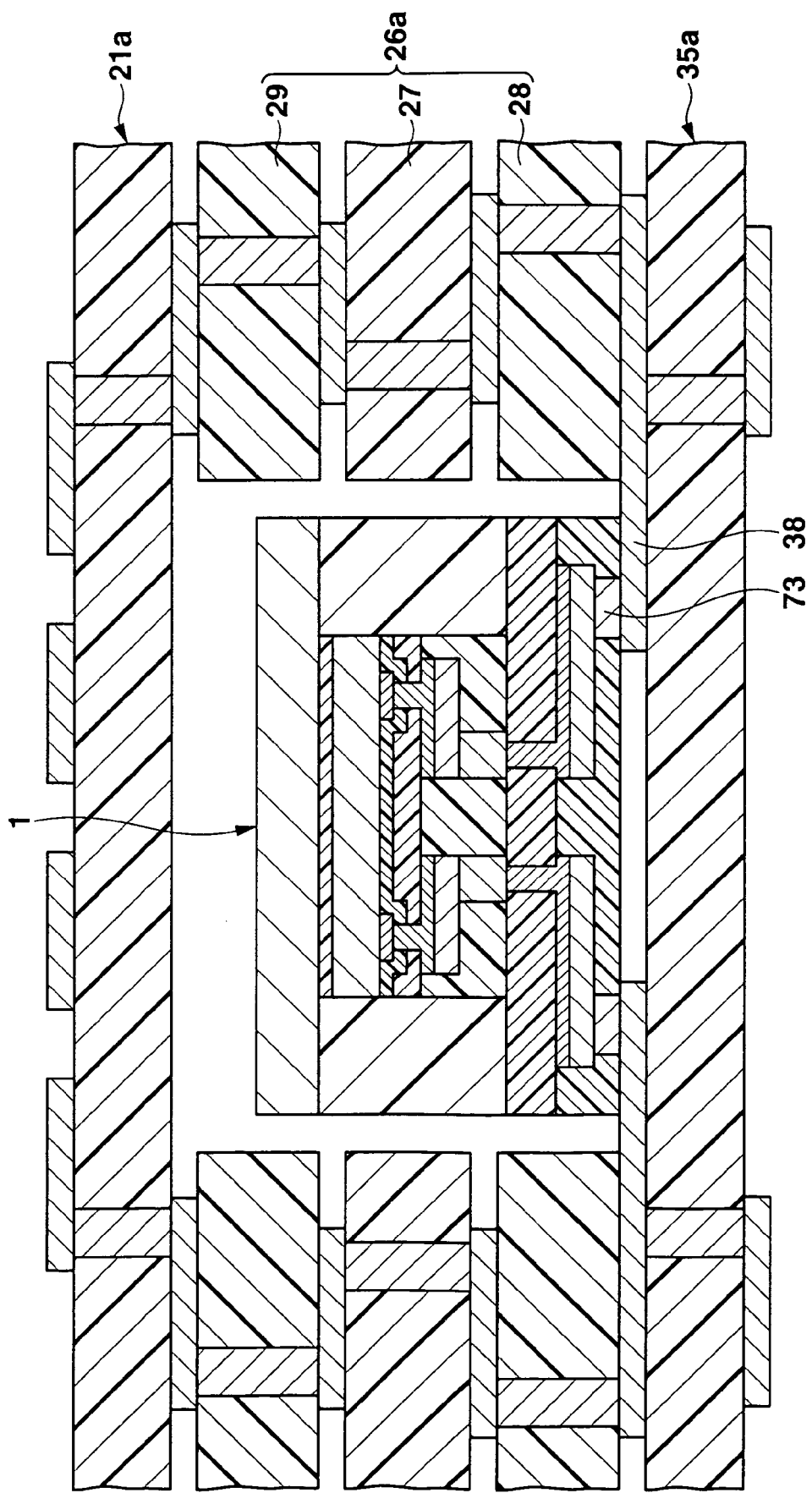
FIG. 21 is a sectional view of a predetermined step when the semiconductor device shown in FIG. 20 is fabricated.

In the fabrication of this semiconductor device, in a step shown in FIG. 21 which corresponds to FIG. 17 of the first embodiment, the semiconductor block 1 is turned upside down, and the conductive connecting portions 73 of the semiconductor block 1 are connected to the lower-surface interconnections 38 of the upper wiring board 35. In this manner, the semiconductor block 1 is placed on the upper surface of the upper wiring board 35, first to third insulating substrates 27 to 29 are arranged on the upper surface of an upper assembly wiring board 35a around the semiconductor block 1, and a lower assembly wiring board 21a is placed on the upper surface of the third insulating substrate 29.

THIRD EMBODIMENT

Figure 22:
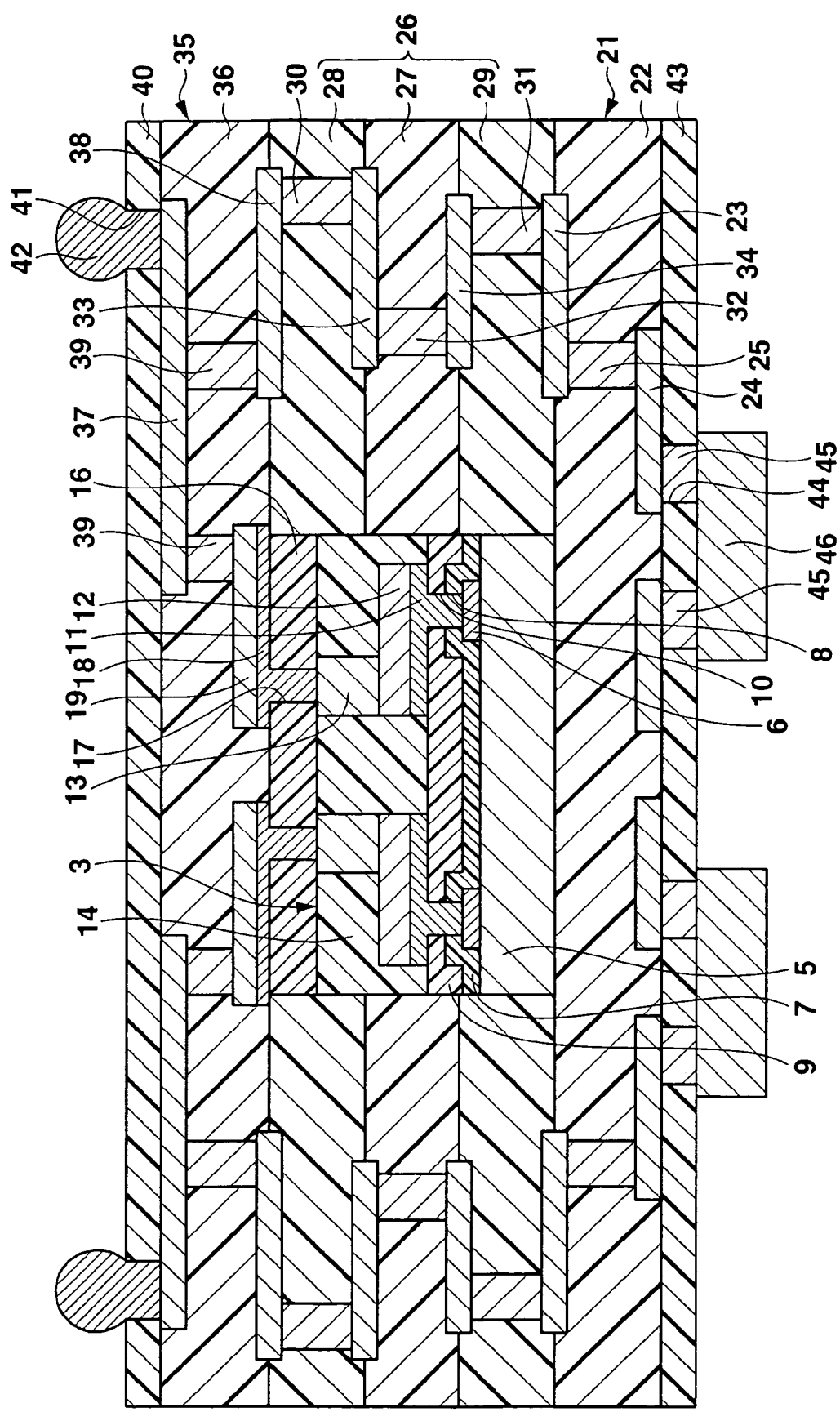
FIG. 22 is a sectional view of a semiconductor device according to the third embodiment of the present invention.

In the first and second embodiments, the semiconductor block 1 is obtained by forming the insulating layer 15 around the semiconductor constructing body 3, and the intermediate wiring board 26 is formed around the semiconductor block 1. By contrast, in the third embodiment shown in FIG. 22, an intermediate wiring board 26 is directly formed around a semiconductor constructing body 3. In the third embodiment, the area of the whole semiconductor device can be reduced by the area of the insulating layer 15 which is omitted. The rest of the arrangement of the third embodiment is the same as the first embodiment, so the same reference numerals as in the first embodiment denote the same parts, and a detailed explanation thereof will be omitted. Note that the adhesive layer 4 is omitted because when a semi-hardened support plate 2 is cured by heating and pressing, a silicon substrate 5 of the semiconductor constructing body 3 is held by the fixing force of the support plate 2. Also, in the third embodiment, an upper insulating film 16 is formed only on the upper surface of the semiconductor constructing body 3. However, it is also possible to substantially level the upper surface of the intermediate wiring board 26 with that of the semiconductor constructing body 3, and allow the upper insulating film 16 to cover the entire surface from the upper surface of the intermediate wiring board 26 to the upper surface of the semiconductor constructing body 3.

OTHER EMBODIMENTS

In the above embodiments, the intermediate wiring board 26 is a multilayered wiring board and obtained by stacking the first to third insulating substrates 27 to 29 made of, e.g., a prepreg material. However, it is also possible to use a double-sided wiring structure having through-hole plating conductive portions.

Also, in the above embodiments, the semiconductor constructing body 3 has the columnar electrodes 13 as external connecting electrodes. However, the semiconductor constructing body 3 may also have interconnections 12 having connecting pad portions as external connecting electrodes, instead of the columnar electrodes, or may also have connecting pads 6 as external connecting electrodes, instead of the columnar electrodes and interconnections. In addition, in the above embodiments, the upper interconnections of the semiconductor block 1 are made up a single layer. However, these upper interconnections may also be formed by two or more layers.

In the above embodiments, the semiconductor wafer is cut between the semiconductor constructing bodies 3 adjacent to each other. However, two or more semiconductor constructing bodies 3 may also be separated together as one set. In this case, the types of a plurality of semiconductor constructing bodies 3 forming one set can be either the same or different.

Furthermore, in the above embodiments, the chip part 46 is mounted as an electronic part. However, a semiconductor constructing body which is, e.g., a bare chip or CSP may also be mounted. Also, regardless of whether a chip part or semiconductor constructing body is mounted, solder balls can be used instead of the conductive connecting portions 45. Solder balls can also be used instead of the conductive connecting portions 73 shown in FIG. 20.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a base member;
   a semiconductor constructing body formed on the base member, and having a semiconductor substrate and a plurality of external connecting electrodes formed on the semiconductor substrate;
   a wiring board formed around the semiconductor constructing body, and having first interconnections on at least a surface thereof; and
   second interconnections formed on the semiconductor constructing body and wiring board, and electrically connected to the external connecting electrodes of the semiconductor constructing body.

2. A device according to claim 1, wherein the semiconductor constructing body has a sealing film formed between the external connecting electrodes on the semiconductor substrate.

3. A device according to claim 1, wherein the base member has, on at least a surface thereof, third interconnections electrically connected to the first interconnections of the wiring board.

4. A device according to claim 1, wherein the base member is made of a material containing a thermosetting resin.

5. A device according to claim 4, wherein the base member contains a reinforcing material.

6. A device according to claim 4, further comprising an insulating film corresponding to the base member formed on the semiconductor constructing body and second interconnections.

7. A device according to claim 6, wherein the insulating film has substantially the same area as the base member.

8. A device according to claim 6, wherein the insulating film is made of a material containing a thermosetting resin.

9. A device according to claim 6, wherein the insulating film contains a reinforcing material.

10. A device according to claim 6, further comprising fourth interconnections formed on the insulating film.

11. A device according to claim 10, wherein at least one of the fourth interconnections extends over the insulating film, and has a connecting pad portion which is positioned above the wiring board.

12. A device according to claim 11, further comprising an overcoat film which is formed on the insulating film, and covers a portion except for the connecting pad portion of the fourth interconnections.

13. A device according to claim 12, wherein a solder ball is formed on the connecting pad portion of the fourth interconnections and a surface of a portion of the overcoat film near the connecting pad portion, and connected to the connecting pad portion.

14. A device according to claim 1, wherein the wiring board constitutes a multilayered wiring board.

15. A device according to claim 1, further comprising an insulating layer formed between the semiconductor constructing body and wiring board.

16. A device according to claim 1, which further comprises an upper insulating film formed on the semiconductor constructing body, and wherein the second interconnections are formed on the upper insulating film.

17. A device according to claim 1, further comprising a support plate placed between the semiconductor constructing body and base member.

18. A device according to claim 1, wherein the semiconductor constructing body is carried on the base member by a fixing force of the base member.

19. A device according to claim 1, wherein the semiconductor constructing body has columnar electrodes as the external connecting electrodes, and the sealing film is formed between the columnar electrodes on the semiconductor substrate.

20. A device according to claim 19, wherein the semiconductor constructing body has an area larger than the semiconductor substrate, and is integrated with a support plate which supports the semiconductor substrate, and with a peripheral insulating layer which covers side surfaces of the semiconductor substrate and sealing film, thereby forming a semiconductor block together with the semiconductor substrate, columnar electrodes, sealing film, support plate, and peripheral insulating layer.

21. A device according to claim 1, wherein the base member has third interconnections on a surface opposite to the surface on which the semiconductor constructing body is mounted, and electronic parts are electrically connected to the third interconnections.

22. A semiconductor device comprising:
a semiconductor block including a semiconductor substrate, a plurality of external connecting electrodes formed on the semiconductor substrate, a sealing film formed between the external connecting electrodes on the semiconductor substrate and a support plate carrying the semiconductor substrate;
a wiring board formed around the semiconductor block and including a wiring,
a base member carrying the semiconductor block and the wiring board, and having an area;
an insulating film formed on the semiconductor block and the wiring board, the insulating film opposing to the base member and having substantially the same area as the base member, and
a plurality of interconnections formed on at least one of the base member and the insulating film and electrically connected to the external connecting electrodes.

23. A device according to claim 22, further comprising a peripheral insulating film which covers side surfaces of the semiconductor substrate and sealing film.

* * * * *